US010395000B1

(12) United States Patent
Shu et al.

(10) Patent No.: US 10,395,000 B1
(45) Date of Patent: Aug. 27, 2019

(54) METHODS, SYSTEMS, AND COMPUTER PROGRAM PRODUCTS FOR IMPLEMENTING AN ELECTRONIC DESIGN USING VOLTAGE-BASED ELECTRICAL ANALYSES AND SIMULATIONS WITH CORRECTIONS

(71) Applicant: Cadence Design Systems, Inc., San Jose, CA (US)

(72) Inventors: John Yanjiang Shu, Pleasanton, CA (US); Wei Michael Tian, San Jose, CA (US); Richard J. O'Donovan, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 133 days.

(21) Appl. No.: 14/973,341

(22) Filed: Dec. 17, 2015

(51) Int. Cl.
    *G06F 17/50* (2006.01)
(52) U.S. Cl.
    CPC ...... *G06F 17/5081* (2013.01); *G06F 17/5009* (2013.01)
(58) Field of Classification Search
    USPC ........................................................ 716/115
    See application file for complete search history.

(56) References Cited

U.S. PATENT DOCUMENTS

| 8,261,228 | B1* | 9/2012 | Gopalakrishnan ........................... G06F 17/5036 703/14 |
| 8,595,677 | B1 | 11/2013 | Shu et al. |
| 8,667,442 | B1 | 3/2014 | Tian et al. |
| 8,769,456 | B1* | 7/2014 | Krishnan ............ G06F 17/5068 716/106 |
| 8,910,101 | B1* | 12/2014 | Yeh ...................... G06F 17/5031 716/113 |
| 8,954,917 | B1 | 2/2015 | Shu et al. |
| 2007/0186194 | A1* | 8/2007 | Lee ...................... G06F 17/5036 716/111 |

* cited by examiner

*Primary Examiner* — Eric D Lee
(74) *Attorney, Agent, or Firm* — Vista IP Law Group, LLP

(57) ABSTRACT

Various embodiments implement an electronic design with one or more electrical analyses or simulations. Pre-layout and/or post-layout design data of an electronic design or a portion thereof may be identified at a physical design implementation module. A first stage analysis may be performed on the electronic design or the portion thereof at least by computing electrical characteristics with a reduced representation in the electronic design or the portion thereof. Electrical behavior of the electronic design or the portion thereof may be generated at least by performing a second stage analysis on the electronic design or the portion thereof with one or more adjusted electrical characteristics. The electronic design or the portion thereof may then be implemented based in part or in whole upon the one or more electrical analyses or simulations.

20 Claims, 10 Drawing Sheets

METHODS, SYSTEMS, AND COMPUTER PROGRAM PRODUCTS FOR IMPLEMENTING AN ELECTRONIC DESIGN USING VOLTAGE-BASED ELECTRICAL ANALYSES AND SIMULATIONS WITH CORRECTIONS

BACKGROUND

The invention relates to technology for designing and verifying an electronic design, such as the design of an integrated circuit ("IC"). Modern electronic design is typically performed with computer aided design (CAD) tools or electronic design automation (EDA) systems. To design an integrated circuit, a designer first creates high level behavior descriptions of the IC device using a high-level hardware design language (HDL). Common examples of HDLs include Verilog and VHDL. An EDA system typically receives the high level behavioral descriptions of the IC device and translates this high-level design language into netlists of various levels of abstraction. Essentially, the process to implement an electronic device begins with functional design and verification (e.g., using RTL), and then proceeds to physical design and verification.

Circuit designers and verification engineers use different methods to verify circuit designs. One common method of verification is the use of simulation. Simulation dynamically verifies a design by monitoring behaviors of the design with respect to test stimuli. For many types of designs, simulation can and should be performed during the design process to ensure that the ultimate goals are achievable and will be realized by the finished product. The exploding demand for high performance electronic products has increased interest in efficient and accurate simulation techniques for integrated circuits. For analog designs, an analog-based simulation approach such as SPICE or SPICE-like simulations (e.g., FastSPICE, HSPICE, PSPICE, or any other SPICE-based or SPICE-compatible simulations) are commonly used to implement simulation of the design. For digital circuit, equivalent digital simulation is performed.

There are many types of electrical analyses that need to be performed to ensure the proper operation of an electronic design. For example, it is often desirable to analyze power distribution networks to check for potential problems relating to IR drops and/or electro-migration effects. Power distribution networks are used to distribute power and ground voltages from pad/package locations to circuit blocks in a design. With continuously shrinking device dimensions, faster switching frequencies and increasing power consumption in deep submicron technologies can cause large switching currents to flow in the power and ground networks, which degrade performance and reliability.

Due to the resistance of interconnects in the power networks, there is a voltage drop across the network, commonly referred to as IR drop. IR drop is a reduction in voltage that occurs on a power net (e.g., a $V_{DD}$ net) in integrated circuits. IC designs usually assume the availability of an ideal power supply that can instantly deliver any amount of current to maintain the specified voltage throughout the chip. In reality, however, a combination of increasing current per-unit area on the die and narrower metal line widths (which causes an increase in the power-grid resistance) causes localized voltage drops within the power grid, leading to decreased power supply voltage at cells and transistors. These localized drops in the power supply voltage decrease the local operating voltage of the chip, potentially causing timing problems and functional failures. IR drop may be both a local and global phenomena. IR drop can be local phenomenon when a number of cells in close proximity switch simultaneously, causing IR drop in that localized area. A higher power grid resistance to a specific portion of the chip can also cause localized IR drop. IR drop can be a global phenomenon when activity in one region of a chip causes effects in other regions. For example, one logic block may suffer from IR drop because of the current drawn by another nearby logic block.

The recent advances in very deep sub-micron (VDSM) integrated circuits (ICs) have brought new challenges in the physical design methodology process of integrated systems. In modern electronic circuits, geometries become smaller; clock frequencies increase; and on-chip interconnections gain increased importance in the prediction of performance. Nonetheless, it has been found that from 0.13 µm and bellow, ICs are more susceptible to wear-out over time (electro-migration or EM), which requires some degree of built-in fault-tolerance and a careful design planning. Meanwhile, increased power demanded on ever shrunk chip size causes higher current densities within the power routing. High currents also induce EM effects in which metal lines begin to wear out during a chip's lifetime. Electro-migration (EM) is an effect on a circuit caused by movement of ions in a conductor structure, which over time will reduce the effective ability and reliability of the conductor to conduct current from one part of the circuit to another. Electro-migration could significantly decrease the reliability of an IC, resulting in possible errors and failures in the IC product. With modern reductions in feature sizes made possible by improving manufacturing processes, the probability of failure due to electro-migration becomes much more possible due to increases of both the power density and the current density of wiring and power structures.

Therefore, it is important for an EDA verification tool to properly and adequately be able to perform electrical analysis to check for potential IR drop and EM problems.

SUMMARY

Disclosed are method(s), system(s), and article(s) of manufacture for implementing an electronic design with electrical analyses and simulations in one or more embodiments. Some embodiments are directed at a method for implementing an electronic design with electrical analyses and simulations. In these embodiments, design data of an electronic design or a portion thereof such as pre-layout and/or post-layout may be identified at a physical design implementation module. A first stage analysis may be performed on the electronic design or the portion thereof at least by computing electrical characteristics with a reduced representation in the electronic design or the portion thereof. Electrical behavior of the electronic design or the portion thereof may be generated at least by performing a second stage analysis on the electronic design or the portion thereof with one or more adjusted electrical characteristics. The electronic design or the portion thereof may then be implemented based in part or in whole upon the one or more electrical analyses or simulations.

In some of these embodiments, the one or more electrical characteristics may be generated at least by adjusting one or more electrical characteristics based in part or in whole upon one or more criteria. An interface device may be identified from a set of interface devices in the electronic design or the portion thereof; and one or more device characteristics of the interface device may be identified from a data source in some of the immediately preceding embodiments. In addition, one or more operating characteristics of the interface device may further be identified from results of the first stage analysis and/or the second stage analysis.

To generate the one or more electrical characteristics, a determination may be made to decide whether one or more corrections or adjustments are to be applied to the one or more electrical characteristics at least by examining one or more relations including the one or more operating characteristics and the one or more device characteristics in some of the immediately preceding embodiments. In addition or in the alternative, the interface device includes an interface transistor device, the one or more device characteristics include a threshold voltage of the interface transistor device, and the one or more operating characteristics include a gate-to-source voltage, and a drain-to-source voltage of the interface transistor device.

In some embodiments, performing the first stage analysis may include an act of identifying post-layout design data of the electronic design or the portion thereof. A representation for the electronic design or the portion thereof may be identified, if already existing, or constructed anew; and the reduced representation for the representation may be generated at least by performing a network reduction technique to the representation of the electronic design or the portion thereof. In addition or in the alternative, to perform the first stage analysis, a net of interest may be identified from the reduced representation of the electronic design or the portion thereof; one or more interface nodes between the one or more interface devices and the reduced representation of the electronic design or the portion thereof may be identified; and a new net may be determined at least by extending from the net of interest and by including the one or more interface nodes and the one or more interface devices along the new net.

In some embodiments, to perform the first stage analysis, one or more interface node voltage values or interface node voltage waveforms may be determined at the one or more interface nodes; and one or more probe voltage values or probe waveforms may also be determined at one or more probing locations for the one or more interface devices. In addition or in the alternative, to generate the electrical behavior, one or more circuit components may be identified in the reduced representation of the electronic design or the portion thereof; a parasitic injected representation may be generated for the reduced representation at least by combining the one or more circuit components with parasitic information; and an interface device connected to the parasitic injected representation at an interface node may be identified.

In some of these embodiments, at least a part of the electrical characteristics may be attached to or associated with at least the interface node in the parasitic injected representation; and one or more electrical analyses may be initiated and performed on the parasitic injected representation. In some of these immediately preceding embodiments, one or more correction values may be determined for the least the part of the electrical characteristics for the interface device; the one or more adjusted electrical characteristics may be generated at least by adjusting the at least the part of the electrical characteristics based in part or in whole upon the one or more correction values; and a tap current through the interface node into the interface device may be determined by using at least one of the one or more adjusted electrical characteristics.

In some embodiments, the electrical characteristics computed in the first stage analysis comprise only voltage information but not electric current information. In some of these embodiments, physical data of the electronic design or the portion thereof may be identified; electrical parasitics that are associated with the physical data may be characterized; and the electrical behavior may be characterized based in part or in whole upon the electrical parasitics and the physical data. In some of the immediately preceding embodiments, the electrical behavior may be determined at least by performing one or more IR drop analyses. In addition or in the alternative, one or more electro-migration constraints may be identified for the electronic design or the portion thereof; and the electrical behavior may be determined at least by performing one or more electro-migration analyses on the electronic design based in part or in whole upon the one or more electro-migration constraints.

Some embodiments are directed at a hardware system that may be invoked to perform any of the methods, processes, or sub-processes disclosed herein. The hardware system may include at least one processor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1:
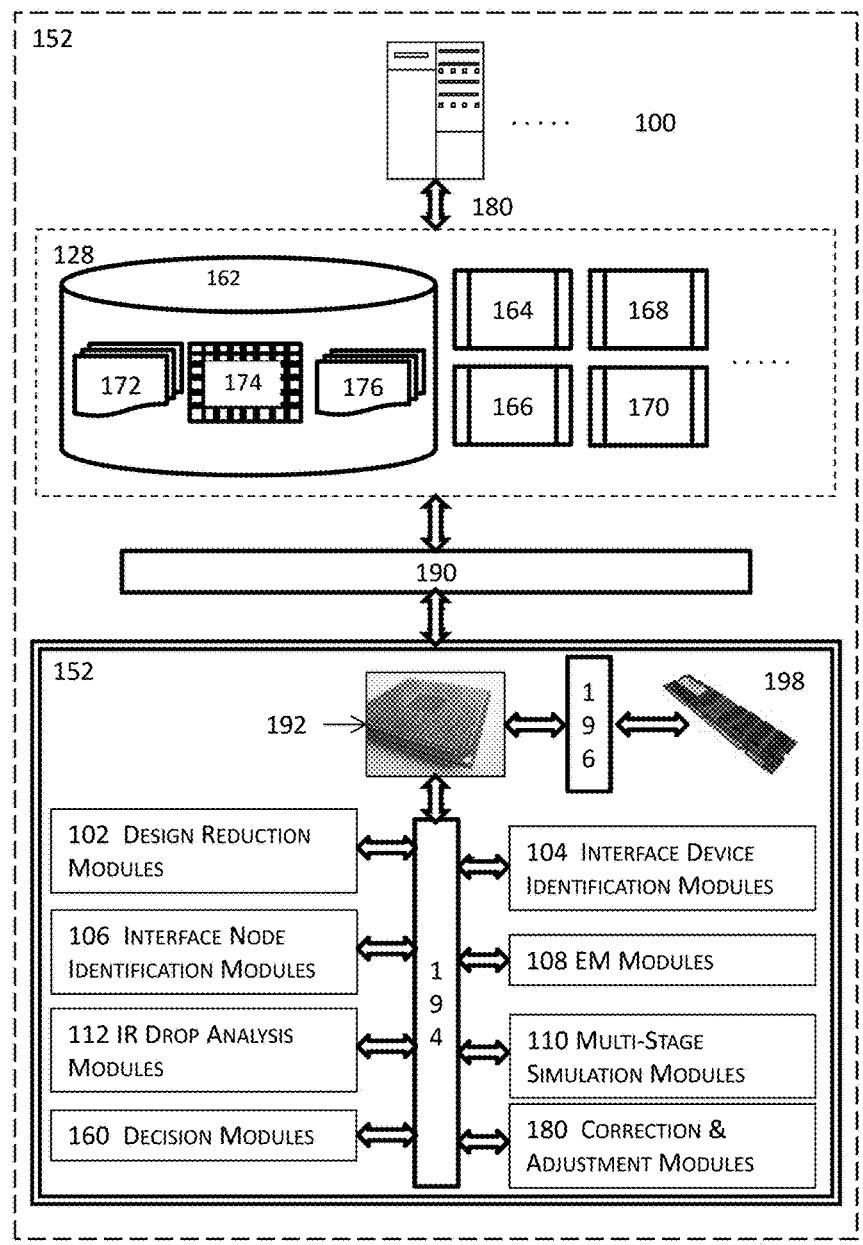
FIG. 1 illustrates a high level block diagram of a hardware system for implementing an electronic design using voltage-based electrical analyses and simulations with corrections in one or more embodiments.

Various embodiments of the invention are directed to methods, systems, and articles of manufacture for implementing an electronic design using voltage-based electrical analyses and simulations with corrections. Other objects, features, and advantages of the invention are described in the detailed description, figures, and claims.

In some embodiments, these methods or apparatuses described herein are directed to a multi-stage electrical analyses or simulations where the first stage electrical analysis is performed on an electronic design including a reduced representation or network and one or more tap nodes at which one or more tap or interface devices are connected to the reduced representation or network. The reduced representation or network receives power from, for example, a power net and supplies power to the tap or interface devices and subsequent logic modules.

In some embodiments, the reduced representation or network is devised or configured to exclude at least some or even all parasitic effects, and the first stage analysis solves for voltage at various nodes (e.g., at the tap nodes) but not any electric current information to avoid intensive computations and iterations. The second stage obtains the first stage analysis results (e.g., voltage information) and performs analyses or simulations on a more complete representation with parasitic information than the reduced representation or network in the first stage analysis.

The second stage may also concurrently compute tap currents through the tap nodes. Nonetheless, the second stage analysis does not non-selectively accept the first stage analysis results to determine the tap currents as well as the electrical behavior of the electronic design with parasitic effects. Rather, a determination is made to decide whether some of the first stage results are to be corrected or adjusted based in part or in whole upon one or more device characteristics and/or one or more operating characteristics of one or more interface devices. If the determination result is affirmative, some of the first stage results (e.g., voltages) may be corrected or adjusted, at least during some time steps of a transient, electrical analysis. Otherwise, the first stage results may be directly applied in determining, for example, some tap currents.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

FIG. 1 illustrates a high level block diagram of a system for implementing an electronic design using voltage-based electrical analyses and simulations with corrections in one or more embodiments. In these one or more embodiments, FIG. 1 illustrates a high level block diagram of a hardware system and may comprise one or more computing systems 100, such as one or more general purpose computers described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access, via a computer bus architecture (e.g., a system bus, a control bus, a data bus, or any combinations thereof), various resources 128 that may comprise a floorplanner, a global routing engine, and/or a detail routing engine 164, a layout editor 166, a design rule checker 168, a verification engine 170, etc.

The one or more computing systems 100 may further write to and read from a local or remote non-transitory computer accessible storage 162 that stores thereupon data or information such as, but not limited to, one or more databases (174) such as schematic design database(s) or physical design database(s), electronic circuit design specification database(s), various statistics, various data, rule decks, various design rules, constraints, etc. (172), or other information or data (176) that may be used to facilitate the performance of various functions to achieve the intended purposes.

In some embodiments, the one or more computing systems 100 may include or, either directly or indirectly through the various resources 128, invoke a set of mechanisms or modules 152 including hardware and software modules or combinations of one or more hardware and one or more software modules that are stored at least partially in computer memory may comprises one or more design reduction modules 102 to reduce a representation of an electronic design (e.g., an RLC network) into a reduced representation such as an RC reduced (or RCR) network, a capacitance only (C-only) network, etc. of the electronic design. The set of modules 152 may further include one or more interface device identification modules 104 to identify interface devices (or tap devices such as current taps).

The set of modules 152 may further optionally include one or more interface or tap node identification modules 106 to identify interface or tap nodes that interconnect one or more interface devices to an electronic design. In addition or in the alternative, the set of modules 152 may further include one or more electro-migration (EM) modules 108 to perform various electro-migration analyses with respect to various EM-related constraints. In some embodiments, the set of modules 152 may further include one or more multi-stage simulation modules 110 to perform multi-stage simulations or analyses on an electronic design of interest with different representations of the underlying electronic design to achieve fast and accurate simulation and/or analysis results.

In addition or in the alternative, the set of modules 152 may comprise one or more decision modules 160 to determine, for example, whether corrections or adjustments to electrical characteristics (e.g., voltages) are to be applied to multi-stage simulations or analyses. The set of modules 152 may also include one or more correction and adjustment modules 180 to identify or determine required or desired corrections or adjustments to one or more electrical characteristics of an electronic design of interest and to apply the required or desired corrections or adjustments to these one or more electrical characteristics of the electronic design of interest.

The set of modules 152 may further optionally include one or more signoff modules (not shown) to perform various signoff and design closure tasks to ensure that the electronic design implemented by various techniques described herein may be successfully fabricated while maintaining various performance, cost, reliability, and manufacturability requirements.

For example, the one or more signoff modules may include one or more timing signoff modules to perform timing analyses and timing closure related tasks (e.g., silicon-accurate timing signoff, signal integrity analyses, etc.) to ensure an electronic design meets power, performance, or other requirements before tapeout, one or more signoff parasitic extraction modules to provide silicon-accurate interconnect parasitic extraction and ensure first-pass silicon success, and one or more power signoff modules to perform various power integrity analyses, transistor-level electro-migration and IR-drop analyses, or other power and signal integrity analyses with SPICE-level accuracy or better accuracy with SPICE or SPICE-like simulations (e.g., Fast-SPICE, HSPICE, PSPICE, or any other SPICE-based or SPICE-compatible simulations) to ensure an electronic design meets or exceeds power, performance, and/or area goals in some embodiments.

The one or more signoff modules may include one or more physical verification modules (not shown) to perform various design rule checking, layout vs. schematic (LVS), etc. tasks to ensure that an electronic design meets or exceeds various spatial and other physical rules and one or more design for manufacturing (DFM) modules to address physical signoff and electrical variability optimization, correct lithography hotspots, predict silicon contours, improve yield, detect and repair timing and leakage hotspots to achieve variation- and manufacturing-aware signoff and design closure in some of these embodiments.

In addition or in the alternative, the one or more signoff modules may include one or more one or more computational lithography modules (not shown) to provide more accurate post-etch critical dimension accuracy and process windows on silicon, reticle and wafer synthesis, etc. to eliminate errors and/or reduce mask-manufacturing cycle times. One or more of these multi-fabric signoff modules may operate on the electronic design produced or modified with various techniques to be described in the following sections for proper signoff and design closure so that the signoff version of the electronic design may be properly manufactured with first-pass or fewer passes silicon success in some embodiments. In these embodiments, the signoff version of the electronic design produced or modified with various techniques described herein causes the underlying electronic circuit to be manufactured by a foundry or IC (integrated circuit) fabrication facility when the signoff version of the electronic design is forwarded to the foundry or IC fabrication facility that in turn fabricates the requisite photomasks and the eventual electronic circuit.

In some embodiments, the computing system 100 may include the various resources 128 such that these various resources may be invoked from within the computing system via a computer bus 180 (e.g., a data bus interfacing a microprocessor 192 and the non-transitory computer accessible storage medium 198 or a system bus 190 between a microprocessor 192 and one or more engines in the various resources 128). In some other embodiments, some or all of these various resources may be located remotely from the computing system 100 such that the computing system may access the some or all of these resources via a computer bus 180 and one or more network components.

The computing system may also include one or more modules in the set of modules 152. One or more modules in the set 152 may include or at least function in tandem with a microprocessor 192 via a computer bus 194 in some embodiments. In these embodiments, a single microprocessor 192 may be included in and thus shared among more than one module even when the computing system 100 includes only one microprocessor 192. A microprocessor 192 may further access some non-transitory memory 198 (e.g., random access memory or RAM) via a system bus 196 to read and/or write data during the microprocessor's execution of processes.

Figure 2:
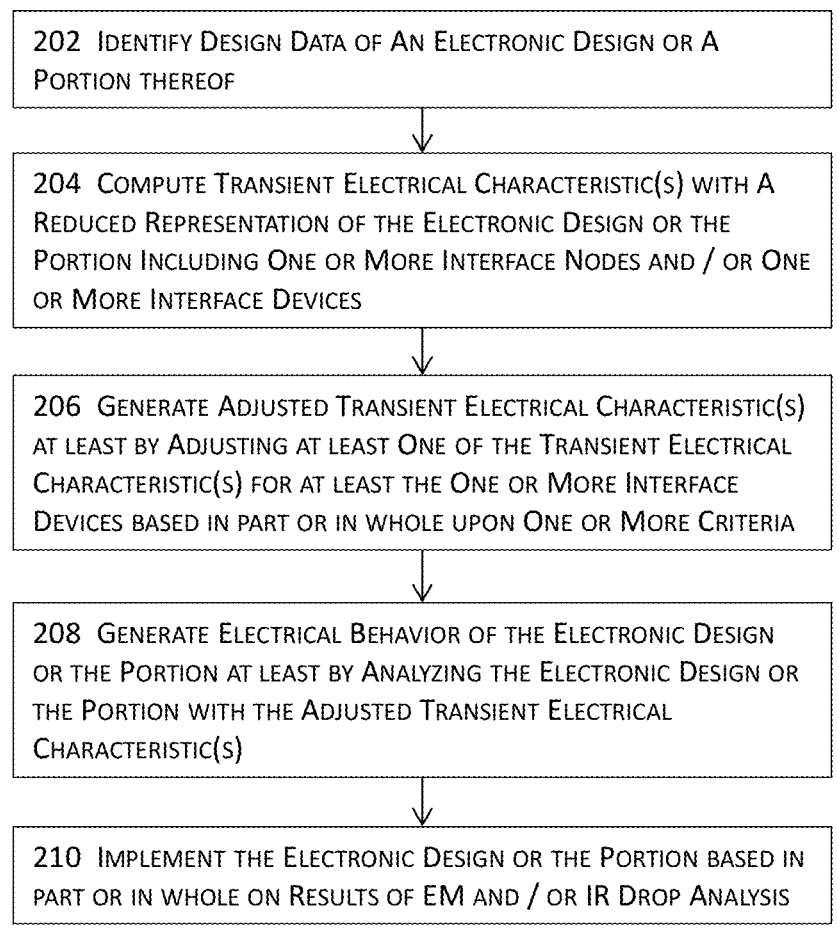
FIG. 2 illustrates a high level block diagram for implementing an electronic design using voltage-based electrical analyses and simulations with corrections in some embodiments.

FIG. 2 illustrates a high level block diagram for implementing an electronic design using voltage-based electrical analyses and simulations with corrections in some embodiments. In these embodiments, design data of an electronic design of interest or a portion thereof may be first identified at 202. These design data may include, for example, pre-layout design data (e.g., schematic design data stored in a schematic design database), post-layout design data (e.g., a layout stored in a layout design database), or a combination thereof.

Transient electrical characteristics may be computed at 204 with a reduced representation of the electronic design or the portion. In some of these embodiments, the transient electrical characteristics may include the voltage waveforms at a plurality of nodes in the electronic design or the portion thereof. In some of these embodiments, the transient electrical characteristics do not include static or transient electric currents in the electronic design or the portion. That is, these embodiments describe a voltage-based, rather than current-based, characterization of the electrical behavior of an electronic design.

One of the advantages of these embodiments that determine the voltage information, rather than the electric current information, at this stage (204) is that current calculations often require solving a system of equations iteratively and thus impose a higher burden on amount of computing resources (e.g., the memory footprint, the runtime, etc.) to arrive at a reasonably accurate set of solutions. It shall be noted that given the voltage-based framework described herein, some embodiments nevertheless concurrently compute electric currents at some interface nodes as described in subsequent paragraphs with reference to FIGS. 3A-D.

In some embodiments, a simplified or abstract representation of the entire underlying electronic design or a portion thereof may be used in computing the transient electrical characteristics at 204. For example, the analyses or simulations may be performed at 202 on a reduced representation having the parasitic effects excluded from consideration in the underlying electronic design in some embodiments. In some other embodiments, the analyses or simulations may be performed at 202 on a capacitance only (C-only) representation that includes only the capacitances while excluding other parasitic effects from consideration.

Yet in other embodiments, the analyses or simulations may be performed at 202 on a reduced representation to which various other RLC reduction techniques may be applied. For example, various moment-matching RLC reduction techniques may be applied to generate a simplified representation of an electronic design that does not exhibit significant inductance effects to preserve stability. As another example, RLC lines in an electronic design may be reduced to RLC lines with fewer circuit components by prescribing capacitances and inductances as functions of resistance. Yet as another example, transmission line theory and models and/or network simplification techniques may be used to generate a reduced representation of the entire RLC network of the underlying electronic design.

The reduced representation of the underlying electronic design may include one or more interface or tap nodes (collectively interface node or interface nodes hereinafter) to which one or more interface or tap devices (collectively interface device or interface devices hereinafter) are connected. An interface node includes a fictitious node in an electronic design where a device is directly connected or adjacent to an RLC reduced net in a reduced representation in some embodiments.

An interface device includes a device (e.g., a transistor) that is directly connected or adjacent to an RLC reduced net in a reduced representation without any intervening circuit components (other than perhaps an interconnect segment in between) in some embodiments. In these embodiments, any devices that are not directly connected or adjacent to an RLC reduced net are not designated as interface devices. In some other embodiments, an interface device may include a device (e.g., a transistor) that is indirectly connected or adjacent to an RLC reduced net in a reduced representation with one or more intervening circuit components (in addition to perhaps an interconnect segment in between) in some embodiments.

For example, some techniques may identify the first two devices along a circuit path from an RLC reduced net as the interface devices. In various embodiments, the identification and designation of interface devices constitutes a design choice based in part or in whole upon one or more criteria including, for example, the nature of the devices, the type of the net to which the devices are connected, the intended purpose of the net, devices, or the underlying electronic design, etc.

It shall be noted that one of the objectives of 204 is to generate the electrical characteristics with reasonable accuracy in a fast manner, and that at least some of these electrical characteristics may be adjusted or corrected in the subsequent stage that produces much better accuracy with various adjustments and corrections to at least some of the electrical characteristics such that the overall multi-stage analysis produces results with high accuracy while saving computing resources such as runtime. As a result, any circuit model or network reduction techniques may be applied to generate a reduced representation for an electronic design that may be used at 204 to compute transient electrical characteristics.

One or more adjusted or corrected transient electrical characteristics may be generated at 206. The adjustment or correction may be required or desired because the electrical characteristics are first computed at 204 with a reduced representation of the underlying electronic design. For example, electrical parasitics may be excluded in the computation of the voltage values at various nodes (e.g., at one or more interface nodes).

As a result of computing these electrical characteristics with a reduced representation, some of these computed electrical characteristics may deviate more than the desired or required accuracy. For example, in the example illustrated in FIG. 5A, reference numeral 508 receives the voltage supply from the voltage source 506 (e.g., $V_{DD}$) and represents an RC reduced network; reference numeral represents interface nodes; and reference numeral 504 represents nodes where voltages are probed. In this example, the reduced RC network 508 may be generated by, for example, neglecting or even shorting all resistors in the original network now represented by the reduced RC network 508.

As a result, the voltage values at the interface nodes 502 may be over-estimated. For example, the voltage at the interface nodes 502 may be VDD when the reduced RC network 508 is obtained by shorting all resistors in the original network now represented by the reduced RC network 508. This voltage is also the drain voltage of the transistor 503A along the circuit path 503. Consequently, when the reduced RC network 508 is obtained by shorting the resistors therein, the drain voltage $V_D$ of the transistor 503A is also $V_{DD}$.

That is, in this simplified example, the supplied voltage $V_{DD}$ is provided from the voltage source 506 through the reduced RC network 508 and unrealistically becomes the drain voltage for transistor 503A without exhibiting any voltage drops. This over-estimated $V_{DD}$ at the interface nodes may be benign sometimes but may cause undesired effects during subsequent characterization of the underlying electronic circuit with a full RLC network at, for example, reference numeral 208. For example, $V_D$ at an interface node 502 may be $V_{DD}$ (e.g., 1.0V) at a first time step during the subsequent characterization, and the interface transistor device 503A causes some small voltage drop of, for example, 0.02V so that the source voltage $V_{DD}$ is determined to be 0.98V.

During the second time step, the characterization may compute the voltage at the interface node 502 with the full RLC network to be 0.9V which is the drain voltage of the interface transistor device 503A. In this example, the n-channel interface transistor device 503A now has the drain voltage of 0.9V and the source voltage of 0.98V and thus cannot perform its intended function as an n-channel transistor.

These one or more adjusted or corrected transient electrical characteristics may be generated at least by adjusting at least one transient electrical characteristic for at least one interface device based in part or in whole upon one or more criteria in some embodiments. For example, a correction or adjustment voltage value may be determined and applied to a source voltage of an interface transistor to adjust the source voltage value.

The one or more criteria dictates whether an adjustment or correction value is to be applied to an electrical characteristic (e.g., a source voltage of an interface transistor) and may include, for example, whether an interface device of interest is in an ON-state, whether the interface transistor device is operating in a triode or linear regime at certain time points, whether the adjustment or correction value is smaller than a prescribed threshold value, any combinations thereof, or any other suitable criteria. More details about whether corrections or adjustments are to be made to one or more electrical characteristics will be described in subsequent paragraphs with reference to FIGS. 3A-D.

At 208, electrical behavior of the electronic design or the portion thereof identified at 202 may be generated at least by performing one or more second stage analyses or simulations with the adjusted or corrected transient electrical characteristics. In characterizing the electrical behavior of the electronic design at 208, the one or more analyses or simulations are performed a more complete representation, rather than on a reduced representation at 204, of the underlying electronic design. For example, the analyses or simulations may be performed on a full RLC network at 208, rather than on a reduced RC network or a C-only network at 204. The incorporation of some or all parasitic effects in the more complete representation of the underlying electronic design or the portion thereof provides a great improvement over convention approaches that often assume a power net (e.g., a power rail or a power stripe) supplying a constant voltage supply (e.g., a constant $V_{DD}$ value) to the interface devices connected to the power net via interface or tap nodes. In addition or in the alternative, the physical design data and/or other physical and electrical data (e.g., thermal data) may further be leveraged to provide even more accurate characterization of electrical parasitics, without assuming some approximated or estimated parasitic effects for the interface devices as conventional approaches often do.

With the more complete representation of the underlying electronic design, electrical parasitics may be more correctly modeled, and the electrical behavior of the underlying electronic design may thus be more accurately characterized. The electronic design or the portion thereof identified at 202 may then be further implemented at 210 based in part or in whole upon the results of the electrical behavior generated at 208. For example, IR drop analyses or EM analyses may be performed with the electrical behavior to identify any violations or potential violations and to initiate fixes to correct these violations or potential violations.

In some embodiments where the one or more electrical characteristics computed at 204 comprise only voltage information but not electric current information, and the adjustments and/or corrections to these one or more electrical characteristics are based on voltage information rather than electrical current information, the generated voltage information and the adjusted voltage information thereof may be used to compute the electric currents on the fly or concurrently during the analyses or simulations at 208 while generating the electrical behavior for the electronic design or the portion thereof.

One of the advantages of computing voltage information during the first stage (e.g., the analyses or simulations performed at 204) and/or the second stage, rather than electric current information, is that the solution process no longer requires solving for electric currents (e.g., electric currents at probed locations) with the electric currents being a part of variables for different portions of a global circuit analysis. Another advantage of computing voltage information, rather than electric current information, is that the time consuming and computation intensive iterative processes of solving for electric currents via the conductance matrix may be avoided. This is especially true when the underlying electronic design operates at a fast switching frequency and hence requires small time-steps in performing transient analyses or simulations. Faster switching frequencies often require smaller time steps and may thus further require longer runtime and more computation resources.

In some embodiments where electric currents at or through tap nodes are concurrently computed, it shall be further noted that these concurrent computations may be done on the fly (e.g., on demand or as needed) with the voltage information in a fast manner, without proceeding through the timing consuming, computation intensive iterative solution process for solving for electric currents.

With the electric current information computed on the fly or concurrently, static and/or transient IR drop may be determined in conjunction with the resistance values of various devices, interconnects, etc., and static and/or transient electric current density information may also be determined with the physical data (e.g., the cross-sectional areas of conductors) to determine the effects of electro-migration.

Figure 3A:
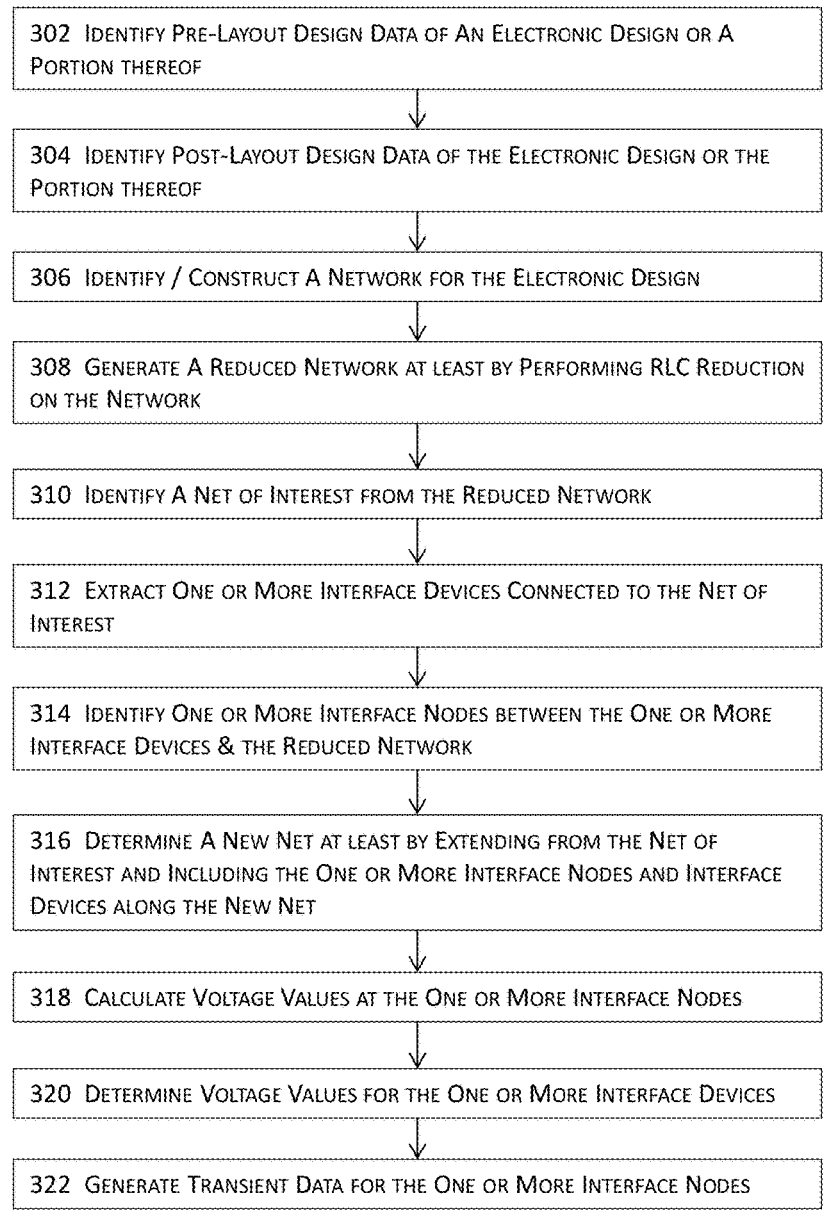
FIG. 3A illustrates a more detailed block diagram for a part of the block diagram for implementing an electronic design using voltage-based electrical analyses and simulations with corrections illustrated in FIG. 2 in some embodiments.

FIG. 3A illustrates a more detailed block diagram for a part of the block diagram for implementing an electronic design using voltage-based electrical analyses and simulations with corrections illustrated in FIG. 2 in some embodiments. More specifically, FIG. 3A illustrates the first stage of a multi-stage simulations or analyses in some embodiments. In these embodiments, pre-layout design data may be identified at 302, and post-layout design data may be identified at 304 for an electronic design or a portion thereof. A network or representation for the electronic design or the portion may be identified, if pre-existing, or constructed anew at 306.

A reduced network or representation may be generated at 308 by performing various RLC reduction or network reduction techniques. For example, an RLC network, an RLC reduced network, or a C-only network (e.g., the reduced RC network or C-only network 508 in FIG. 5A) may be identified or constructed at 306 for the electronic design or the portion thereof.

In some of these embodiments where only a smaller portion (e.g., a smaller portion of a layout) of an electronic design is identified, a simulatable representation may nevertheless be constructed to represent the entire electronic design by using the available pre-layout design data and the post-layout design data. For example, when only a smaller portion of a layout is identified or available, a simulatable representation of the entire electronic design may be constructed by leveraging as much available post-layout design data as possible and utilizing the pre-layout design data (e.g., schematic design data) to generate a simulatable representation for the underlying electronic design despite the unavailability of some post-layout design data.

Figure 5A:
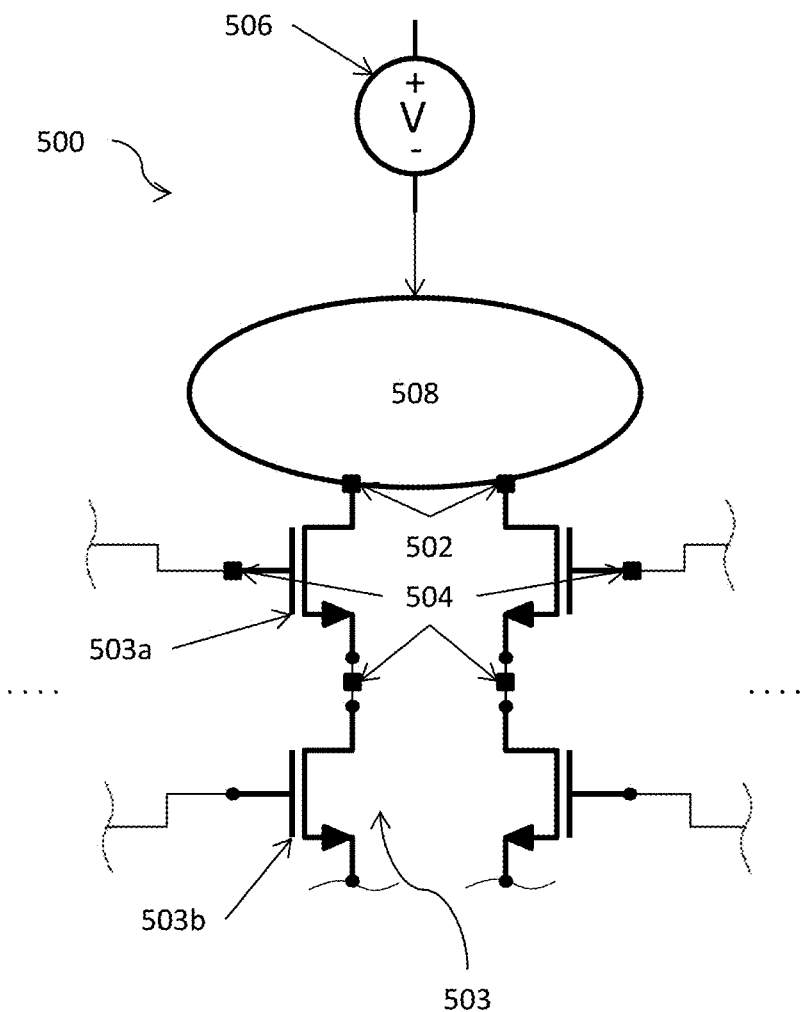
FIG. 5A illustrates an example of a portion of an electronic design on which the first stage analysis may be performed in some embodiments.
Figure 5B:
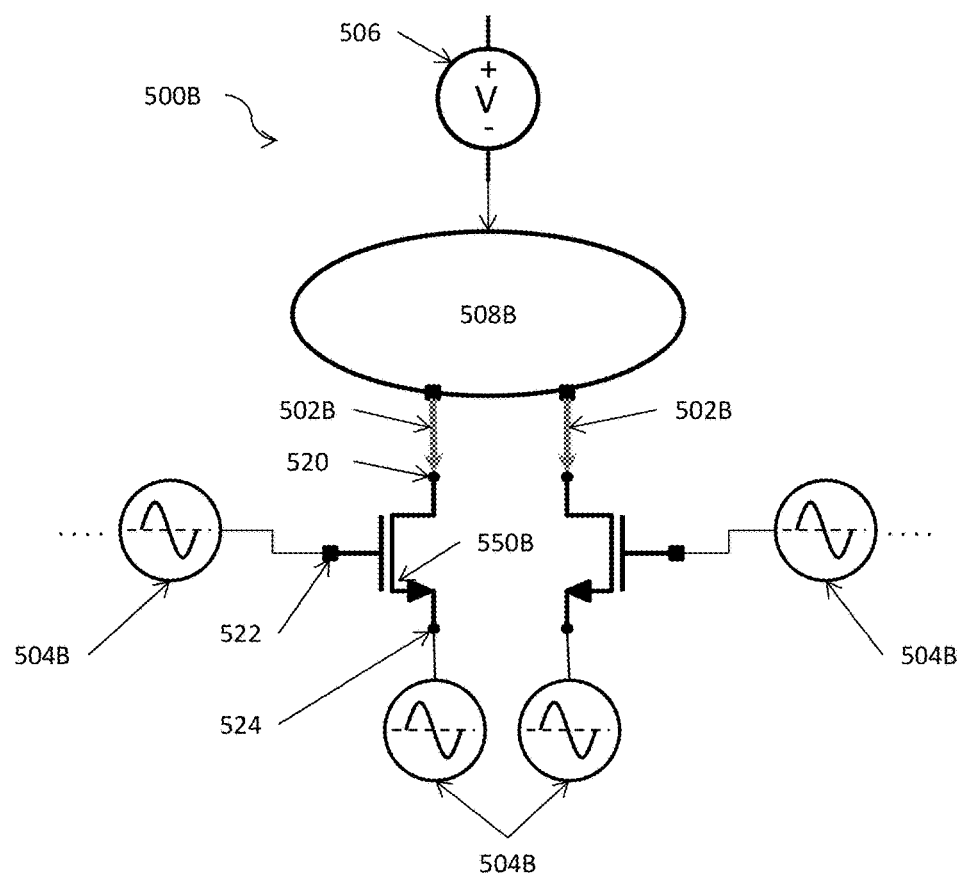
FIG. 5B illustrates an example of a portion of an electronic design on which the second stage analysis with corrections or adjustments to electrical characteristics may be performed in some embodiments.

With the multi-stage simulation and analysis techniques described herein, the representation or network includes a reduced representation of a block of circuit components (e.g., 508 in FIG. 5A) interconnecting a supplied power (e.g., a power rail, a power stripe, a voltage regulator, or a power network in general such as the voltage source 506 of the electronic design 500 in FIG. 5A) and one or more interface devices (e.g., the interface transistor devices 503A and 503B in FIG. 5A) that control, drive, and/or supply power to the remainder of the electronic design (e.g., signal blocks, logic blocks, etc. such as the logic modules 504B in FIG. 5B).

The reduced representation or network identified or constructed at 306 may be generated by various RLC reduction techniques. For example, various moment-matching RLC reduction techniques may be applied to generate a simplified representation of an electronic design that does not exhibit significant inductance effects to preserve stability. As another example, RLC lines in an electronic design may be reduced to RLC lines with fewer circuit components by prescribing capacitances and inductances as functions of resistance.

Yet as another example, transmission line theory and models and/or network simplification techniques may be used to generate a reduced representation of the entire RLC network of the underlying electronic design. Yet as another example, the reduced representation or network may be generated by shorting or collapsing all resistors into one or more nodes to the extent possible while leaving the capacitances in the reduced representation (e.g., a capacitance only or C-only representation or network).

In some embodiments, a reduced representation or network may be devised in such a way to exclude some or even all parasitic effects. As described above, one of the objectives of the first stage of the described multi-stage simulations or analyses is to generate the electrical characteristics (e.g., voltages) with reasonable accuracy in a fast manner, and that at least some of these electrical characteristics generated during the first stage may be adjusted or corrected in the subsequent stage to produce much better accuracy with various adjustments and corrections to at least some of the electrical characteristics such that the overall multi-stage analysis produces results with high accuracy while saving computing resources such as runtime.

In addition, with the voltage-based approach that focuses on voltages rather than electric currents, time consuming iterations (e.g., iterative process to solve the conductance matrix problem with a linear solver) may be avoided in solving for the electric currents in the electronic design, and the runtime of the multi-stage, voltage-based approach to produce complete and accurate electrical behavior for an electronic design of interest may be further reduced.

With the reduced representation or network generated at 308, a net of interest (e.g., a power net) connecting the reduced representation and downstream devices may be identified at 310. In the example illustrated in FIG. 5A where 508 represents a reduced network, the net along circuit path 503 connected to the reduced representation 508 at the interface node 502 may be identified at 310.

Note that the circuit path 503 connects the interface devices 503A and 503A (nMOS in this example) and may include the interface nodes 502 and 504 that are further connected to other devices or blocks of circuit components. One or more interface devices that are connected to the net of interest may be extracted at 312. In the aforementioned example, the interface device 503A that are directed connected and adjacent to the reduced representation 508 may be extracted at 312 in some embodiments.

In some other embodiments, the interface device 503A as well as the indirectly connected interface device 503B may both be extracted at 312. In various embodiments, the identification and designation of interface devices constitutes a design choice based in part or in whole upon one or more criteria including, for example, the nature of the devices, the type of the net to which the devices are connected, the intended purpose of the net, devices, or the underlying electronic design, etc.

One or more interface nodes between the one or more interface devices identified at 312 and the reduced representation or network may be identified at 314. In the aforementioned example with reference to FIG. 5A, interface nodes 502 at which at least the interface device 503A is directly connected to the reduced network 508 may be identified at 314. A new net may be optionally determined at 316 by extending from the net of interest and including the one or more interface nodes identified at 314 and/or the one or more interface devices identified at 312 in some embodiments.

One or more electrical characteristics (e.g., voltages) may be determined at 318 for the one or more interface nodes as well as for nodes of interests of the one or more interface devices or for the new net at 320, if available. In the aforementioned example with reference to FIG. 5A, voltage values may be determined at, for example, the interface nodes 502 and the probe locations 504 in some embodiments. In some embodiments where a transient analysis or simulation is performed upon the reduced network or representation, transient data (e.g., transient electrical behavior, voltage waveforms, etc.) may be generated at 322 by performing the transient analysis or simulation across a series of time steps.

Figure 3B:
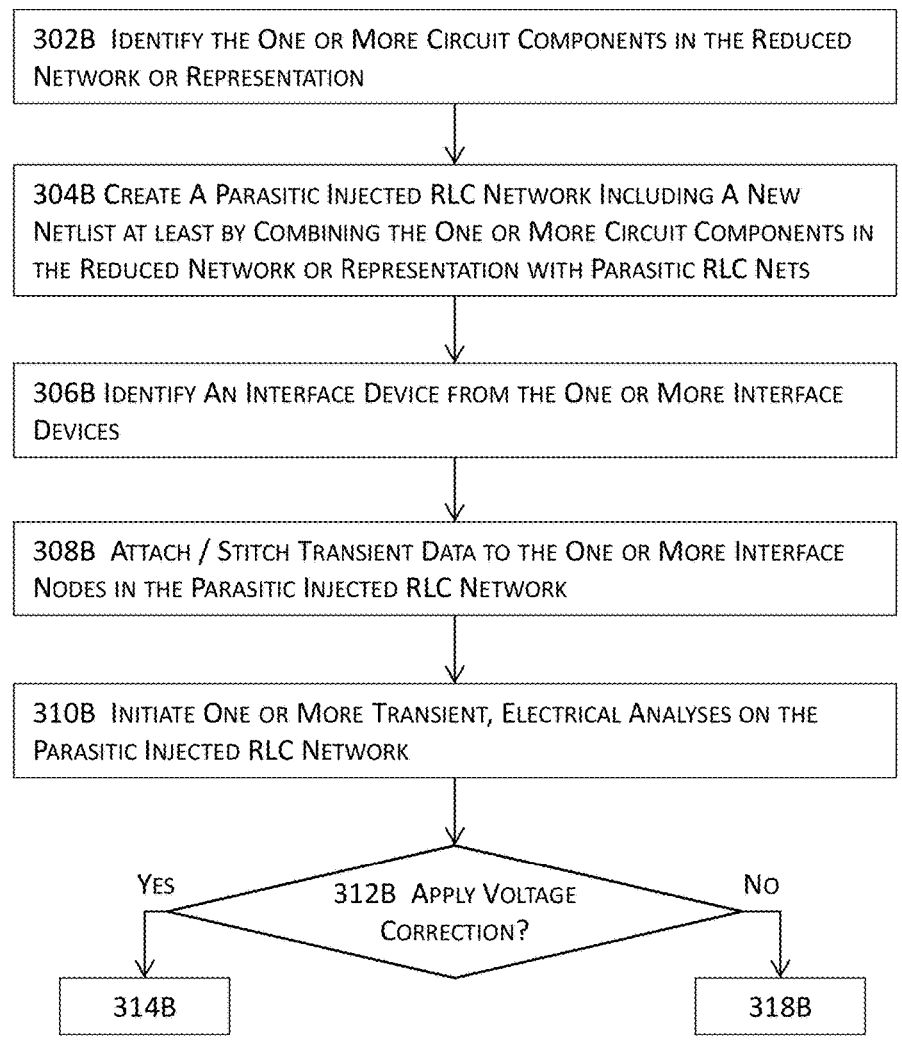
FIGS. 3B-3C jointly illustrate a more detailed block diagram for a part of the block diagram for implementing an electronic design using voltage-based electrical analyses and simulations with corrections illustrated in FIG. 2 in some embodiments.
Figure 3C:
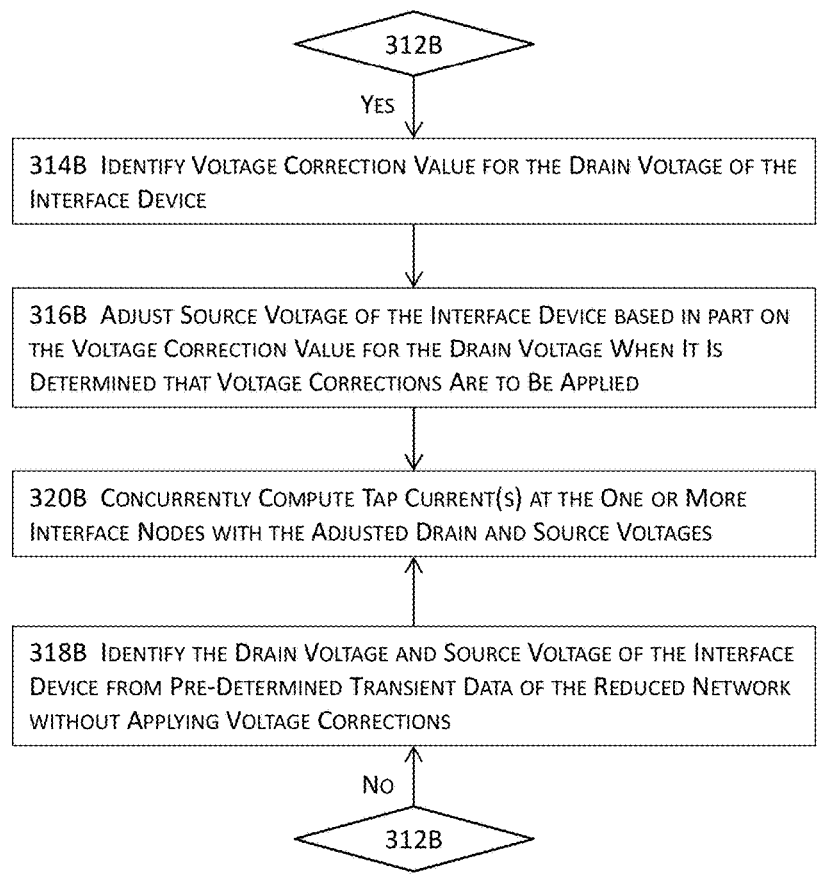

FIGS. 3B-C jointly illustrate a more detailed block diagram for a part of the block diagram for implementing an electronic design using voltage-based electrical analyses and simulations with corrections illustrated in FIG. 2 in some embodiments. More specifically, FIG. 3B-C illustrates the second stage of a multi-stage analyses or simulations in some embodiments. In these embodiments, one or more circuit components in the reduced network or representation may be identified at 302B.

The one or more circuit components identified at 302B may include, for example, the circuit components in the full RLC network including wires, interconnects, etc. in some embodiments so that the electrical behavior of the electronic design or the portion thereof (e.g., the electronic design or the portion identified at 302) may more accurately represent the electronic design or the portion thereof. That is, unlike the first stage that performs analyses or simulations on a reduced network or representation, a parasitic injected network or representation, which is a more complete or even a full RLC network (e.g., a full RLC network 508B in FIG. 5B), may be created at 304B.

In some embodiments, the parasitic injected network or representation may include, for example, a new netlist at least by combining the one or more interface devices (e.g., 550B in FIG. 5B) identified at 302B with the parasitic RLC nets. It shall be noted that although some embodiments refer to a full RLC network, some network reduction techniques may nevertheless be applied to reduce the size of the parasitic injected network or representation in some other embodiments depending upon criteria such as the accuracy requirements for the analysis or simulation results.

An interface device (e.g., an interface transistor device 550B in FIG. 5B) may be identified at 306B from the one or more interface devices identified at, for example, 314 of FIG. 3A. In some of these embodiments, one or more electrical characteristics (e.g., voltages, voltage waveforms, etc.) for one or more nodes of the identified interface device may also be identified at 306B.

The corresponding one or more electrical characteristics may be attached or stitched to the interface node for the identified interface device and/or one or more other nodes (e.g., one or more probe locations such as 502 for the drain voltage $V_D$, 522 for the gate voltage $V_G$, and 524 the source voltage $V_S$ of the electronic design 500B in FIG. 5B) associated with the interface device at 308B. Once all the interface nodes and/or interface devices have been processed, one or more transient electrical analyses or simulations may be initiated at 310B on the electronic design including the parasitic injected representation or network.

The performance of electrical analyses or simulations may be considered as the second stage analysis or simulation of the multi-stage analyses or simulations.

A determination may be made at 312B to decide whether voltage corrections or adjustments are to be applied to at least some of the electrical characteristics of the electronic design. The determination may be based upon one or more criteria. For example, whether voltage corrections or adjustments are to be applied to at least some of the electrical characteristics may be determined based in part or in whole upon one or more operating characteristics or modes of one or more interface devices. In the example illustrated in FIG. 5B, an interface device 550B controls or supplies power to logic modules 504B.

In the event when the interface device 550B is in the cutoff regime (e.g., the interface transistor device 550B is in an OFF state), adjustments or corrections may not be performed. As another example, when the interface transistor device 550B is in the saturation regime where the interface transistor device acts as a switch, adjustments or corrections may not be performed. Yet as another example, when the interface transistor device 550B is operating in a linear regime, corrections or adjustments may be applied to at least some electrical characteristics. More details about the determinations of whether voltage corrections or adjustments are to be applied to at least some of the electrical characteristics of the electronic design will be described below with reference to FIG. 3D.

If the determination at 312B is affirmative, a correction or adjustment value for an interface device may be identified or determined at 314B. As described in the example in the description of reference numeral 206 in FIG. 2, the source voltage ($V_S$) may be corrected by using the following equation in some embodiments:

$$V_{S,\ 2nd} = V_{D,\ 2ND} - (V_{D,\ 1ST} - V_{S,\ 1ST}) \quad (1)$$

In the above equation, $V_{S,\ 2ND}$ represents source voltage of the interface transistor device 550B in the second stage simulation (e.g., a voltage value at a particular time step during the second stage simulation or analysis); $V_{D,\ 2ND}$ represents drain voltage of the interface transistor device 550B in the second stage; $V_{D,\ 1ST}$ represents drain voltage of the interface transistor device 503A in the first stage; and $V_{S,\ 1ST}$ represents source voltage of the interface transistor device 550B in the first stage.

In this example, the source and drain voltage behave similarly so that when the drain voltage ($V_D$) is corrected, the source voltage ($V_S$) is also corrected in a similar manner (e., both $V_D$ and $V_S$ are corrected or adjusted to become smaller to reflect voltage drop due to parasitic effects). The electrical characteristic may then be adjusted or corrected at 316B. In the aforementioned example, the source voltage in the second stage of the multi-stage analysis or simulation may be adjusted by subtracting the difference between the drain voltage and source voltage determined from the first stage from the drain voltage determined during an iteration of the second stage analysis or simulation.

Tap currents at one or more interface nodes may be concurrently determined at 320B by using the one or more adjusted electrical characteristics. In the above example, the tap current 502B at, for example, interface node 502 may be concurrently computed by using at least the drain voltage and the source voltage determined during the iterations of the second stage analysis or simulation. In these voltage-based techniques, the tap currents may be concurrently computed on the fly without having to solve for the electric currents via iterative processes which often require intensive computation resources and runtime. For example, when the interface transistor device 550B is operating in the triode or linear regime with the drain voltage and source voltage provided above, the tap current 502B may be determined by using the following equation:

$$I_D = \mu_n \times C_{OX} \times \frac{W}{L} \times \left[(V_{GS} - V_{TH}) \times V_{DS} - \frac{V_{DS}^2}{2}\right] \quad (2)$$

In the above equation, $C_{OX}$ denotes the capacitance of the oxide layer; n denotes the slope factor and equals to one (1) plus the capacitance of the depletion layer ($C_D$) divided by $C_{OX}$; $V_{TH}$ denotes the threshold voltage of the interface transistor device 550B; $V_{GS}$ denotes the gate to source voltage; $V_{DS}$ denotes the drain to source voltage; and W and L respective denotes the width and length of the gate.

On the other hand, if the determination at 312B is negative, the electrical characteristics (e.g., drain voltage and the source voltage for the example illustrated in FIGS. 5A-B) of an interface device may be identified from the results of the first stage analysis or simulation, and these electrical characteristics may be applied to the second stage analyses or simulations without any corrections or voltages. Tap currents at one or more interface nodes may be similarly determined at 320B by using the electrical characteristics obtained from the first stage simulation or analysis results. In some embodiments where the determination result of 312B is negative, the interface device may be in an OFF state or in an operating regime other than a linear or triode regime. In these embodiments, the interface device may be ignored from further analysis to further preserve computational resources, at least during the time when the interface device remains in the same state.

Figure 3D:
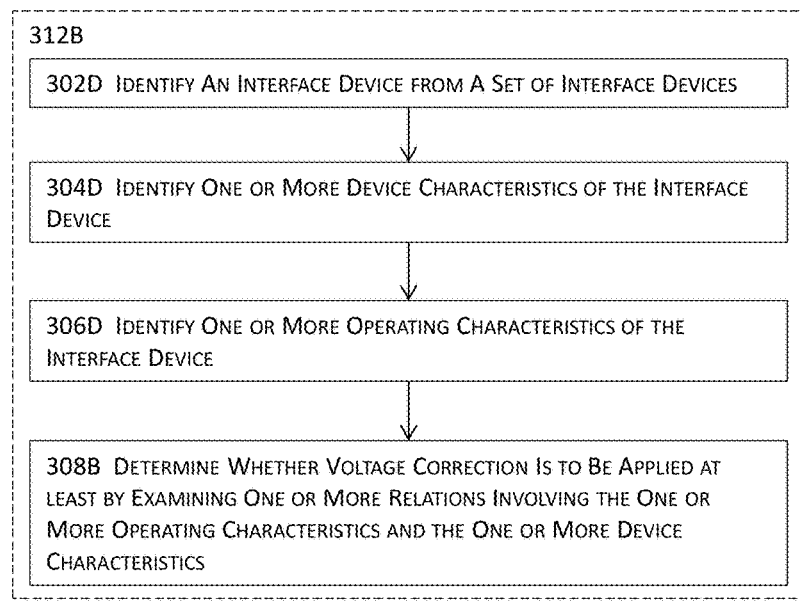
FIG. 3D illustrates a more detailed block diagram for a part of the block diagram for implementing an electronic design using voltage-based electrical analyses and simulations with corrections illustrated in FIGS. 3B-C in some embodiments.

FIG. 3D illustrates a more detailed block diagram for a part of the block diagram for implementing an electronic design using voltage-based electrical analyses and simulations with corrections illustrated in FIGS. 3B-C in some embodiments. More specifically, FIG. 3D illustrates a block diagram for determine whether to apply corrections or adjustments to one or more electrical characteristics of an interface device. In these embodiments, an interface device may be identified at 302D from a set of interface devices. The device specification or characterization of the identified interface device from, for example, a foundry that manufactures such interface devices in some of these embodiments. One or more device characteristics may be identified at 304D for the identified interface device.

In the example illustrated in FIGS. 5A-B, the one or more device characteristics may include the threshold voltage of the nMOS (n-channel metal-oxide semiconductor) device 503A, 503B, and 550B. In some embodiments, the operating regimes and their respective requirements or characteristics may also be identified at 304D. In the nMOS example of the interface device 550B in FIG. 5B, the threshold voltage of the interface transistor device 550B may be identified at 304D as a device characteristic. One or more operating characteristics may be identified at 306D. These one or more operating characteristics may be used in the subsequent determination of whether one or more electrical characteristics of the interface device are to be adjusted or corrected.

It may then be determined whether corrections or adjustments to one or more electrical characteristics are to be applied at 308D at least by examining one or more relations involving the one or more operating characteristics identified at 306D and the one or more device characteristics identified at 304D. In the example of the interface nMOS device 550B in FIG. 5B, In some embodiments, an interface device may be subject to corrections or adjustments when the interface device is in the ON state. In the example of the interface nMOS device 550B, this criterion may be translated into the first relation (3) and the second relation (4) below:

$$V_{DS} > V_{TH} \tag{3}$$

$$V_{DS} > 0 \tag{4}$$

In the above relations, $V_{DS}$ denotes the drain-to-source voltage; $V_{GS}$ denotes the gate-to-source voltage; and $V_{TH}$ denotes the threshold voltage of the interface nMOS device, which has been identified as a device characteristic at 304D. The gate voltage may also be identified from the simulation or analysis results of the first stage in some embodiments. In addition, the first interface nMOS device may be required or desired to be operating in the linear or triode regime. This criterion may be translated in the third relation below:

$$V_{DS} < (V_{GS} - V_{TH}) \tag{5}$$

With these criteria determined, whether an interface device (e.g., the nMOS 503A in FIG. 5A and 550B in FIG. 5B) satisfies these criteria to qualify for voltage corrections or adjustments may be determined at 308B during the second stage simulations or analyses to produce an even more accurate analysis or simulation results from the second stage of the multi-stage analyses or simulations.

Figure 4:
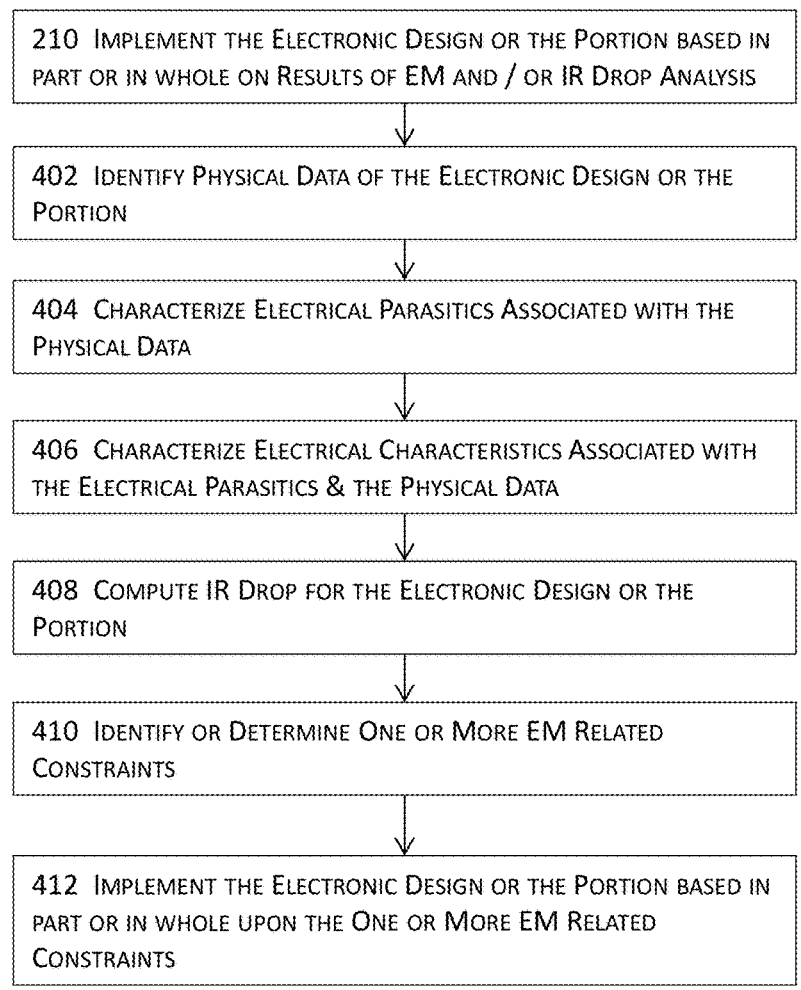
FIG. 4 illustrates a more detailed block diagram for a part of the block diagram for implementing an electronic design using voltage-based electrical analyses and simulations with corrections illustrated in FIG. 2 in some embodiments.

FIG. 4 illustrates a more detailed block diagram for a part of the block diagram for implementing an electronic design using voltage-based electrical analyses and simulations with corrections illustrated in FIG. 2 in some embodiments. More specifically, FIG. 4 illustrates a more detailed block diagram for the act 210 of implementing an electronic design or a portion thereof based in part or in whole upon results of EM and/or IR drop analysis. In these embodiments, physical data of the electronic design or a portion thereof may be identified at 402.

The physical data may be identified at 402 for circuit components including, for example, a net, a portion of a net, a device, a circuit component, a cell, a block, etc. The physical data may include, for example, width, length, cross-sectional area, descriptions of gate, source, and drain regions, materials, electrical properties (e.g., bulk resistivity), thermal properties, etc. in some embodiments.

Electrical parasitics associated with the physical data may be characterized at 404. For example, resistance values, self-inductance and/or coupled-inductance values, gate to contact capacitance, gate related fringe capacitance values, cross-coupling capacitance values, any other parasitic values or effects, or any combinations thereof may be characterized at 404 by using at least the physical data identified at 402 in some embodiments.

Electrical characteristics associated with the electrical parasitics and the physical data may be characterized at 406. For example, average, root-mean squared (RMS), or peak electric currents, voltages, current densities may be characterized at 406 from the first stage and/or the second stage analysis or simulation results. With the electrical parasitics characterized at 404 and the electrical characteristics characterized at 406, IR drop effects may be computed at 408 for the electronic design or the portion thereof.

For example, voltages at various nodes in the electronic design or the portion thereof may be determined by determining the voltage drops of various current flows through various resistive components in the electronic design or the portion thereof and examining whether the nodal voltages may cause any undesired effects.

In addition or in the alternative, one or more electro-migration related constraints may be identified at 410. These one or more electro-migration related constraints may include, for example, one or more limits on current densities for one or more nets, devices, or circuit components, one or more functions of the physical data, the electrical parasitics, or any combinations thereof (e.g., a constraint expressed as a function of the geometric dimensions), Black's equation for electro-migration reliability of a wire, or any other suitable constraints concerning diffusions (e.g., boundary diffusion, bulk diffusion, surface diffusion, etc.), thermal effects, lattice structures, etc. that may affect the electro-migration effects.

Electro-migration analysis may then be performed with the electrical characteristics, the electrical parasitics, and the physical data to determine whether the electronic design or the portion thereof identified at 402 may exhibit some weak areas as far as electro-migration reliability is concerned. The electronic design or the portion thereof may then be implemented at 412 based in part or in whole upon the results of the IR drop analysis and/or the electro-migration analysis. For example, the electronic design may be modified locally to address any IR drop or EM concerns or violations to ensure the correctness of the physical data and/or other data while observing the requirements of the IR drop and/or electro-migration analysis results.

SYSTEM ARCHITECTURE OVERVIEW

Figure 6:
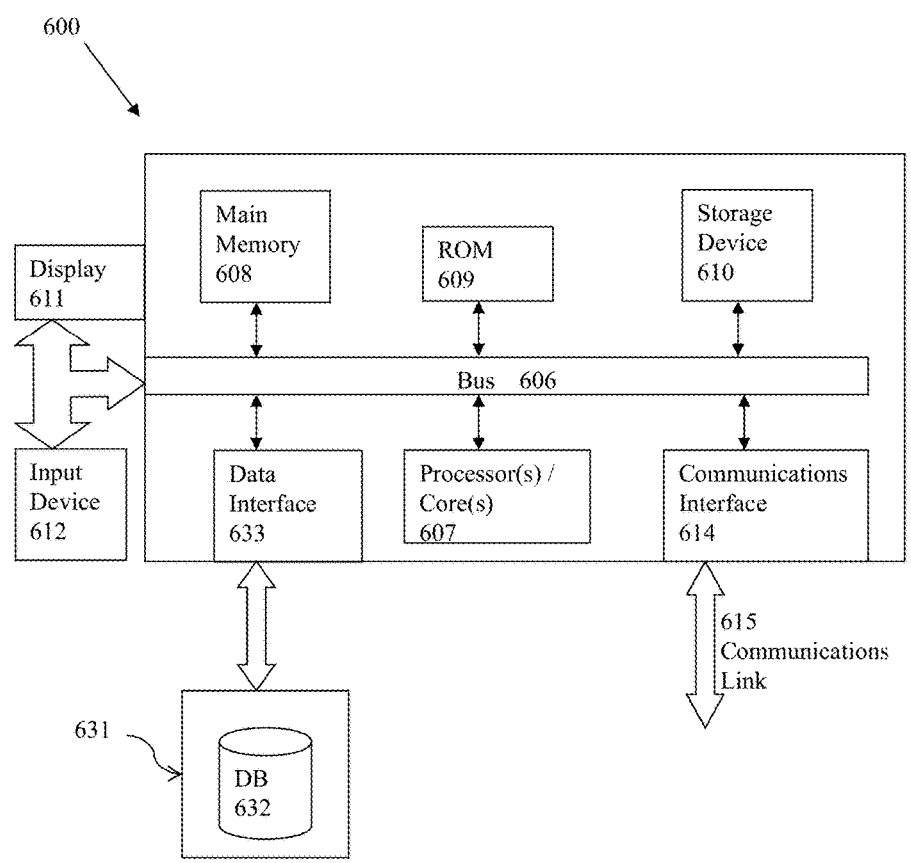
FIG. 6 illustrates a computerized system on which a process for implementing an electronic design using voltage-based electrical analyses and simulations with corrections may be implemented.

FIG. 6 illustrates a block diagram of a simplified illustration of a computing system 600 suitable for FIG. 6 illustrates a computerized system on which a method for implementing an electronic design using voltage-based electrical analyses and simulations with corrections as described in the preceding paragraphs with reference to various figures. Computer system 600 includes a bus 606 or other communication module for communicating information, which interconnects subsystems and devices, such as processor 607, system memory 608 (e.g., RAM), static storage device 609 (e.g., ROM), disk drive 610 (e.g., magnetic or optical), communication interface 614 (e.g., modem or Ethernet card), display 611 (e.g., CRT or LCD), input device 612 (e.g., keyboard), and cursor control (not shown).

According to one embodiment, computer system 600 performs specific operations by one or more processor or processor cores 607 executing one or more sequences of one or more instructions contained in system memory 608. Such instructions may be read into system memory 608 from another computer readable/usable storage medium, such as static storage device 609 or disk drive 610. In alternative embodiments, hard-wired circuitry may be used in place of or in combination with software instructions to implement the invention. Thus, embodiments of the invention are not limited to any specific combination of hardware circuitry and/or software. In one embodiment, the term "logic" and "module" shall mean any combination of software and/or hardware that is used to implement all or part of the invention. In these embodiments, to the extent a "module" or "logic" includes any software portion, at least a part of the software portion is stored in a non-transitory computer readable storage medium (e.g., random access memory or RAM) for execution by one or more processors or one or more processor cores.

Various actions or processes as described in the preceding paragraphs may be performed by using one or more processors, one or more processor cores, or combination thereof 607, where the one or more processors, one or more processor cores, or combination thereof executes one or more threads. For example, the act of extracting, the act of determining, the act of representing, the act of generating, the act of performing one or more analyses, etc. may be performed by one or more processors, one or more processor cores, or combination thereof.

The term "computer readable storage medium" or "computer usable storage medium" as used herein refers to any non-transitory medium that participates in providing instructions to processor 607 for execution. Such a medium may take many forms, including but not limited to, non-volatile media and volatile media. Non-volatile media includes, for example, optical or magnetic disks, such as disk drive 610. Volatile media includes dynamic memory, such as system memory 608.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 600. According to other embodiments of the invention, two or more computer systems 600 coupled by communication link 615 (e.g., LAN, PTSN, or wireless network) may perform the sequence of instructions required to practice the invention in coordination with one another.

Computer system 600 may transmit and receive messages, data, and instructions, including program, i.e., application code, through communication link 615 and communication interface 614. Received program code may be executed by processor 607 as it is received, and/or stored in disk drive 610, or other non-volatile storage for later execution. In an embodiment, the computer system 600 operates in conjunction with a data storage system 631, e.g., a data storage system 631 that includes a database 632 that is readily accessible by the computer system 600. The computer system 600 communicates with the data storage system 631 through a data interface 633.

A data interface 633, which is coupled to the bus 606 (e.g., memory bus, system bus, data bus, etc.), transmits and receives electrical, electromagnetic or optical signals that include data streams representing various types of signal information, e.g., instructions, messages and data. In embodiments of the invention, the functions of the data interface 633 may be performed by the communication interface 614.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for implementing an electronic design with one or more voltage-based electrical analyses or simulations, comprising:
   identifying, at a physical electronic design implementation module including or functioning in conjunction with at least one processor and at least partially stored in a non-transitory computer readable storage medium, design data of an electronic design or a portion thereof for an electronic circuit;
   performing, at a design reduction module stored at least partially in memory of the non-transitory computer readable storage medium, multi-stage processes on the electronic design or the portion thereof while avoiding performance of iterations that involves a matrix equation for solving certain electrical behaviors at least by:
      reducing the electronic design or the portion thereof into a reduced representation at least by eliminating at least one type of electrical components and further by representing the at least one type, which is eliminated, as a different type of electrical components in the electronic design or the portion thereof;
      performing a first stage analysis on the reduced representation of the electronic design or the portion thereof based at least in part upon a first requirement pertaining to computational resource utilization at least by computing first electrical characteristics with the reduced representation of the electronic design or the portion thereof while avoiding the performance of the iterations that involves the matrix equation for solving one or more second electrical characteristics in one or more devices in at least a part of the electronic design or the portion thereof during the first stage analysis; and
      generating electrical behavior of the electronic design or the portion thereof based at least in part upon a second requirement pertaining to accuracy of predicted circuit behaviors at least by performing a second stage analysis on a different representation of the electronic design or the portion thereof in determining at least the one or more second electrical characteristics using at least one or more adjusted electrical characteristics adjusted from one or more corresponding first electrical characteristics, without the performance of the iterations that involves the matrix equation for solving the one or more second electrical characteristics; and
   reducing or eliminating photomask manufacturing errors or reducing photomask manufacturing cycle times using the electronic design or the portion thereof that is implemented based in part or in whole upon the electrical behavior.

2. The computer implemented method of claim 1, further comprising at least one of:
   reducing, at the design reduction module, the electronic design or the portion thereof into the reduced representation at least further by eliminating one or more types of electrical characteristics from the reduced representation, wherein the one or more types of electrical characteristics that are eliminated comprise capacitances or inductances;
   ignoring one or more first interface devices in the electronic design or the portion thereof from the second stage analysis based in part or in whole upon the electrical behavior; or
   reducing or eliminating one or more errors in one or more photomasks for the electronic design or the portion thereof at least by implementing the electronic design or the portion thereof based in part or in whole upon the electrical behavior.

3. The computer implemented method of claim 2, generating the one or more adjusted electrical characteristics comprising:
   generating the one or more adjusted electrical characteristics at least by adjusting one or more electrical characteristics of the electrical characteristics based in part or in whole upon one or more criteria;
   identifying an interface device from a set of interface devices in the electronic design or the portion thereof;
   identifying one or more device characteristics of the interface device from a data source; and
   identifying one or more operating characteristics of the interface device from results of the first stage analysis and/or the second stage analysis.

4. The computer implemented method of claim 3, generating the one or more adjusted electrical characteristics further comprising:
   determining whether one or more corrections or adjustments are to be applied to the one or more electrical characteristics at least by examining one or more relations including the one or more operating characteristics and the one or more device characteristics.

5. The computer implemented method of claim 4, wherein the interface device includes an interface transistor device, the one or more device characteristics include a threshold voltage of the interface transistor device, and the one or more operating characteristics include a gate-to-source voltage and a drain-to-source voltage of the interface transistor device.

6. The computer implemented method of claim 1, performing the first stage analysis comprising:
   identifying post-layout design data of the electronic design or the portion thereof;
   identifying or constructing a representation for the electronic design or the portion thereof; and
   generating the reduced representation for the representation at least by performing a network reduction technique to the representation of the electronic design or the portion thereof.

7. The computer implemented method of claim 1, performing the first stage analysis comprising:
   identifying a net of interest from the reduced representation of the electronic design or the portion thereof;
   extracting one or more interfaces connected to the net of interest;
   identifying one or more interface nodes between one or more interface devices and the reduced representation of the electronic design or the portion thereof; and
   determining a new net at least by extending from the net of interest and by including the one or more interface nodes and the one or more interface devices along the new net.

8. The computer implemented method of claim 1, performing the first stage analysis comprising:
   determining one or more interface node voltage values or interface node voltage waveforms at one or more interface nodes; and
   determining one or more probe voltage values or probe waveforms at one or more probing locations for one or more interface devices.

9. The computer implemented method of claim 1, generating the electrical behavior of the electronic design or the portion thereof at least by performing a second stage analysis comprising:
   identifying one or more circuit components in the reduced representation of the electronic design or the portion thereof;
   generating a parasitic injected representation for the reduced representation at least by combining the one or more circuit components with parasitic information; and
   identifying an interface device connected to the parasitic injected representation at an interface node.

10. The computer implemented method of claim 9, generating the electrical behavior of the electronic design or the portion thereof at least by performing a second stage analysis comprising:
   attaching or associating at least a part of the electrical behavior to at least the interface node in the parasitic injected representation; and
   initiating one or more electrical analyses on the parasitic injected representation.

11. The computer implemented method of claim 10, generating the electrical behavior of the electronic design or the portion thereof at least by performing a second stage analysis comprising:
   determining one or more correction values for at least the part of the electrical behavior for the interface device;
   generating the one or more adjusted electrical characteristics at least by adjusting the at least the part of the electrical characteristics based in part or in whole upon the one or more correction values; and
   determining a tap current through the interface node into the interface device by using at least one of the one or more adjusted electrical characteristics.

12. The computer implemented method of claim 11, implementing the electronic design or the portion thereof comprising:
   identifying physical data of the electronic design or the portion thereof;
   characterizing electrical parasitics that are associated with the physical data; and
   characterizing the electrical behavior based in part or in whole upon the electrical parasitics and the physical data.

13. The computer implemented method of claim 12, implementing the electronic design or the portion thereof comprising:
   determining the electrical behavior at least by performing one or more IR drop analyses.

14. The computer implemented method of claim 12, implementing the electronic design or the portion thereof comprising:
   identifying one or more electro-migration constraints for the electronic design or the portion thereof; and
   determining the electrical behavior at least by performing one or more electro-migration analyses on the electronic design based in part or in whole upon the one or more electro-migration constraints.

15. The computer implemented method of claim 1, wherein the electrical characteristics computed in the first stage analysis comprise only voltage information but not electric current information.

16. An article of manufacture comprising a non-transitory computer accessible storage medium having stored thereupon a sequence of instructions which, when executed by at least one processor or at least one processor core executing one or more threads, causes the at least one processor or the at least one processor core to perform a set of acts for implementing an electronic design with one or more voltage-based electrical analyses or simulations, the set of acts comprising:

identifying, at a physical electronic design implementation module including or functioning in conjunction with the at least one processor and at least partially stored in a non-transitory computer readable storage medium, design data of an electronic design or a portion thereof for an electronic circuit;

performing, at a design reduction module stored at least partially in memory of the non-transitory computer readable storage medium, multi-stage processes on the electronic design or the portion thereof while avoiding performance of iterations that involves a matrix equation for solving certain electrical behaviors at least by:

reducing the electronic design or the portion thereof into a reduced representation at least by eliminating at least one type of electrical components and further by representing the at least one type, which is eliminated, as a different type of electrical components in the electronic design or the portion thereof;

performing a first stage analysis on the reduced representation of the electronic design or the portion thereof based at least in part upon a first requirement pertaining to computational resource utilization at least by computing first electrical characteristics with a reduced representation of the electronic design or the portion thereof while avoiding the performance of the iterations that involves the matrix equation for solving one or more second electrical characteristics—in or one or more devices of at least a part of the electronic design or the portion thereof during the first stage analysis; and generating electrical behavior of the electronic design or the portion thereof based at least in part upon a second requirement pertaining to accuracy of predicted circuit behaviors at least by performing a second stage analysis on a different representation of the electronic design or the portion thereof in determining at least the one or more second electrical characteristics using at least one or more adjusted electrical characteristics adjusted from one or more corresponding first electrical characteristics, without the performance of the iterations that involves the matrix equation for solving the one or more second electrical characteristics; and reducing or eliminating photomask manufacturing errors or reducing photomask manufacturing cycle times using the electronic design or the portion thereof that is implemented based in part or in whole upon the one or more electrical analyses or simulations.

17. The article of manufacture of claim 16, the set of acts further comprising:

a first set of acts, comprising:

identifying post-layout design data of the electronic design or the portion thereof;

identifying or constructing a representation for the electronic design or the portion thereof; and generating the reduced representation for the representation at least by performing a network reduction technique to the representation of the electronic design or the portion thereof;

a second set of acts, comprising:

identifying a net of interest from the reduced representation of the electronic design or the portion thereof;

extracting one or more interfaces connected to the net of interest;

identifying one or more interface nodes between one or more interface devices and the reduced representation of the electronic design or the portion thereof; and determining a new net at least by extending from the net of interest and by including the one or more interface nodes and the one or more interface devices along the new net;

a third set of acts, comprising:

determining one or more interface node voltage values or interface node voltage waveforms at the one or more interface nodes; and determining one or more probe voltage values or probe waveforms at one or more probing locations for the one or more interface devices; and/or a fourth set of acts, comprising:

identifying one or more circuit components in the reduced representation of the electronic design or the portion thereof;

generating a parasitic injected representation for the reduced representation at least by combining the one or more circuit components with parasitic information;

identifying an interface device connected to the parasitic injected representation at an interface node;

attaching or associating at least a part of the electrical characteristics to at least the interface node in the parasitic injected representation; and initiating one or more electrical analyses on the parasitic injected representation.

18. A system for implementing an electronic design with one or more voltage-based electrical analyses or simulations, comprising:

non-transitory computer accessible storage medium storing thereupon program code;

a physical electronic design implementation module that includes or functions in conjunction with at least one microprocessor of a computing system, is at least partially stored in a non-transitory computer readable storage medium, and is configured to identify design data of an electronic design or a portion thereof for an electronic circuit; and a design reduction module that is stored at least partially in memory of the non-transitory computer accessible storage medium and functions in conjunction with the at least one microprocessor, wherein the design reduction module is further coupled to the physical electronic design implementation module and is configured to execute the program code that performs multi-stage processes on the electronic design or the portion thereof while avoiding performance of iterations that involves a matrix equation for solving certain electrical behaviors;

the design reduction module coupled to the physical electronic design implementation module and configured to execute the program code that performs the multi-stage process is further configured to execute the program code that reduces the electronic design or the portion thereof into a reduced representation at least by eliminating at least one type of electrical components and further by representing the at least one type, which is eliminated, as a different type of electrical components in the electronic design or the portion thereof;

the physical electronic design implementation module and the design reduction module are further configured to execute the program code that performs a first stage analysis on the reduced representation of the electronic design or the portion thereof based at least in part upon a first requirement pertaining to computational resource utilization at least by computing first electrical characteristics with a reduced representation of the electronic design or the portion thereof while avoiding performance of iterations that involves a matrix equation for solving one or more second electrical characteristics in or one or more devices of at least a part of the electronic design or the portion thereof during the first stage analysis;

the physical electronic design implementation module and the design reduction module are further configured to execute the program code that generates electrical behavior of the electronic design or the portion thereof based at least in part upon a second requirement pertaining to accuracy of predicted circuit behaviors at least by performing a second stage analysis on a different representation of the electronic design or the portion thereof in determining at least the one or more second electrical characteristics using at least one or more adjusted electrical characteristics adjusted from one or more corresponding first electrical characteristics, without the performance of the iterations that involves the matrix equation for solving the one or more second electrical characteristics; and the physical electronic design implementation module is configured to execute the program code that reduces or eliminates photomask manufacturing errors or reducing photomask manufacturing cycle times using the electronic design or the portion thereof that is implemented based in part or in whole upon the one or more electrical analyses or simulations.

19. The system for claim 18, wherein the at least one processor is further configured to generate the one or more adjusted electrical characteristics at least by adjusting one or more electrical characteristics of the electrical behavior based in part or in whole upon one or more criteria.

20. The system for claim 19, wherein the at least one processor that is to generate the one or more adjusted electrical characteristics is further configured to identify an interface device from a set of interface devices in the electronic design or the portion thereof, to identify one or more device characteristics of the interface device from a data source, to identify one or more operating characteristics of the interface device from results of the first stage analysis and/or the second stage analysis, and/or to determine whether one or more corrections or adjustments are to be applied to the one or more electrical characteristics at least by examining one or more relations including the one or more operating characteristics and the one or more device characteristics.

* * * * *